(12) United States Patent
Briggs et al.

(10) Patent No.: US 10,134,674 B2
(45) Date of Patent: *Nov. 20, 2018

(54) STRUCTURE AND METHOD FOR IMPROVED STABILIZATION OF COBALT CAP AND/OR COBALT LINER IN INTERCONNECTS

(71) Applicant: International Business Machines Corporation, Armonk, NY (US)

(72) Inventors: Benjamin David Briggs, Waterford, NY (US); James J. Kelly, Schenectady, NY (US); Koichi Motoyama, Clifton Park, NY (US); Roger Allan Quon, Rhinebeck, NY (US); Michael Rizzolo, Albany, NY (US); Theodorus Eduardus Standaert, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/676,263

(22) Filed: Aug. 14, 2017

(65) Prior Publication Data

US 2018/0005953 A1  Jan. 4, 2018

Related U.S. Application Data

(63) Continuation of application No. 15/198,721, filed on Jun. 30, 2016, now Pat. No. 9,780,035.

(51) Int. Cl.
*H01L 23/532* (2006.01)
*H01L 21/768* (2006.01)
*H01L 21/288* (2006.01)

(52) U.S. Cl.
CPC ...... *H01L 23/53238* (2013.01); *H01L 21/288* (2013.01); *H01L 21/76846* (2013.01); *H01L 21/76847* (2013.01); *H01L 21/76849* (2013.01)

(58) Field of Classification Search
CPC combination set(s) only.
See application file for complete search history.

(56) References Cited

U.S. PATENT DOCUMENTS

| | | |
|---|---|---|
| 5,277,985 A | 1/1994 | Li et al. |
| 5,917,244 A | 6/1999 | Lee et al. |
| 6,355,983 B2 | 3/2002 | Graas et al. |
| 6,800,554 B2 | 10/2004 | Marieb et al. |
| 6,979,642 B1 | 12/2005 | Buynoski et al. |

(Continued)

OTHER PUBLICATIONS

D. B. Briggs et al., "Low-Temperature Diffusion Doping of Copper Interconnects Independent of Seed Layer Composition," U.S. Appl. No. 14/862,580, filed Sep. 23, 2015.

*Primary Examiner* — Mamadou Diallo
(74) *Attorney, Agent, or Firm* — Vazken Alexanian; McGinn IP Law Group, PLLC

(57) ABSTRACT

A method of fabricating a metallization layer of a semiconductor device in which copper is used for an interconnect material and cobalt is used to encapsulate the copper. A material is introduced that will interact with the cobalt to cause a hexagonal-close-packed (HCP) crystal structure of cobalt to change to a face-centered-cubic (FCC) crystal structure of cobalt, the FCC crystal structure providing a resistance of the cobalt to migrate.

20 Claims, 9 Drawing Sheets

(56) References Cited

U.S. PATENT DOCUMENTS

| | | | |
|---|---|---|---|
| 9,076,846 B2 | 7/2015 | Ryan et al. | |
| 2005/0064702 A1* | 3/2005 | Wang | H01L 21/76819 438/633 |
| 2007/0292604 A1* | 12/2007 | Dordi | H01L 21/0206 427/99.5 |
| 2008/0296768 A1 | 12/2008 | Chebiam et al. | |
| 2011/0045171 A1 | 2/2011 | McFeely et al. | |
| 2013/0075908 A1* | 3/2013 | Cabral, Jr. | H01L 23/53238 257/751 |
| 2014/0183738 A1 | 7/2014 | Jezewski et al. | |
| 2014/0327141 A1* | 11/2014 | Yu | H01L 23/53238 257/751 |
| 2015/0021672 A1 | 1/2015 | Chuang et al. | |
| 2015/0126028 A1* | 5/2015 | Ryan | H01L 21/76883 438/653 |
| 2015/0130062 A1* | 5/2015 | Carbonell | H01L 21/76883 257/741 |
| 2015/0203961 A1* | 7/2015 | Ha | C23C 16/045 427/124 |
| 2015/0235957 A1 | 8/2015 | Zhang et al. | |
| 2016/0056076 A1* | 2/2016 | Edelstein | H01L 21/76879 438/627 |

\* cited by examiner

STRUCTURE AND METHOD FOR IMPROVED STABILIZATION OF COBALT CAP AND/OR COBALT LINER IN INTERCONNECTS

This application is a Continuation application of U.S. patent application Ser. No. 15/198,721, filed on Jun. 30, 2016.

BACKGROUND

The present invention relates to semiconductor fabrication and, more specifically, to an introduction of nickel to stabilize a cobalt liner or cap in copper interconnects.

Because copper (Cu) is a better conductor than aluminum, it has commonly been used for years in chips because metal components can be smaller. But copper can cause problems if not properly contained within the chip, so cobalt (Co) has been used for encapsulating copper as a liner along with a capping layer. The liner and cap enclose the copper, which can improve reliability by up to ten times or more.

However, cobalt is mobile in current 7-nm (nanometer) and 10-nm interconnects, both as a cobalt liner and as a cobalt cap. The movement/diffusion of cobalt has been linked with degraded electromigration lifetimes, particularly when a cobalt cap is combined with a ruthenium (Ru) liner.

Additionally, as exemplarily shown in FIG. 1, the divot 102 at the cobalt/copper interface after CMP (chemical mechanical planarization/polishing) causes poor dielectric cap coverage and can also degrade reliability by allowing oxygen in.

The present inventors have explored these cobalt mobility and divot issues and developed an approach to ameliorate these problems.

SUMMARY

The present invention provides a solution to this cobalt mobility problem by introducing a material, such as nickel (Ni), inside interconnects, for purpose of stabilizing the cobalt. Most conventional methods focus on alloying the copper itself in a Cu-based interconnect, to attempt to reduce the electromigration of copper.

In contrast, the present invention uses, for example, nickel, to alloy with cobalt in the cobalt cap and/or liner material to address the electromigration of copper, mechanisms intended to resist the degradation of the cobalt, so that the cobalt liner and cobalt cap can better perform their intended copper-encapsulation function. The present invention recognizes that the noted degradation of the cobalt is due to its mobility at higher temperatures and during operation due to high current flow, so that mechanisms can be introduced to ameliorate cobalt degradation. The present invention has also been demonstrated to lower CMP divot resistance by up to 5% and improves the electric cap coverage and integrity.

DETAILED DESCRIPTION

As is well understood in the art, semiconductor chip fabrication traditionally includes a Front-End-Of-the-Line (FEOL) stage, followed by a Middle-Of-the-Line (MOL) stage and then a Back-End-Of-the-Line (BEOL) stage. Typical FEOL processes include wafer preparation, isolation, well formation, gate patterning, spacer, extension and source/drain implantation, silicide formation, and dual stress liner formation, which is basically the fabrication of electronic components in the wafer substrate. The MOL stage is mainly for gate contact formation, and BEOL is the stage in which the individual devices and components (transistors, capacitors, resistors, etc.) get interconnected with wiring on the wafer, which is to say that BEOL fabricates a plurality of metallization layers. A chip will typically have one layer of devices/components fabricated during FEOL but can have up to twelve or more metallization layers implemented in BEOL.

The present invention is directed primarily to the BEOL stage of wafer processing and, more particularly, to the version of BEOL using copper as interconnect wiring. An initial step in each BEOL metallization layer processing typically includes CMP (chemical mechanical planarization/polishing) in which the top surface of the wafer is polished using an abrasive and corrosive chemical slurry, commonly a colloid, in conjunction with a polishing pad and a retaining ring typically of a greater diameter than the wafer.

Figure 2:
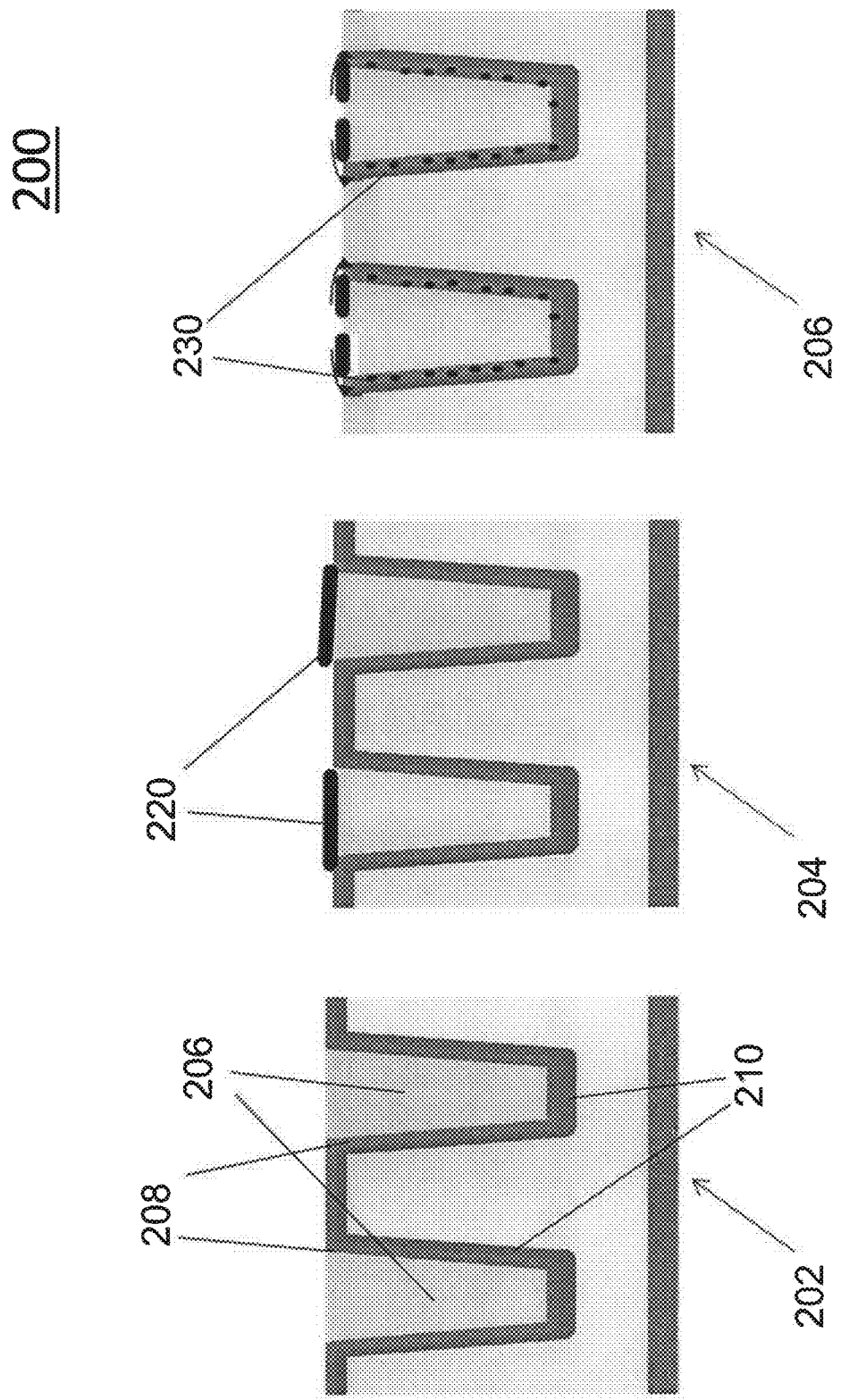
FIG. 2 illustrates the sequence 200 of how Co diffuses from the cobalt cap into a ruthenium (Ru) liner.

FIG. 2 shows a sequence 200 that demonstrates an aspect of the problem recognized by the present inventors and being addressed by the present invention, the diffusion of cobalt from the cap into the Ru liner. Thus, as of the CMP stage 202 for a BEOL metallization layer, the wafer includes a number of trenches 204 filled with copper lines 206, Ru liners 208, and cobalt liners 210. In stage 204, cobalt metal has been deposited to form cobalt caps 220. Stage 206 shows diffusion 230 of cobalt from the cobalt caps into the Ru liner that occurs during subsequent processing steps in which temperatures can reach up to 400° C.

Figure 3:
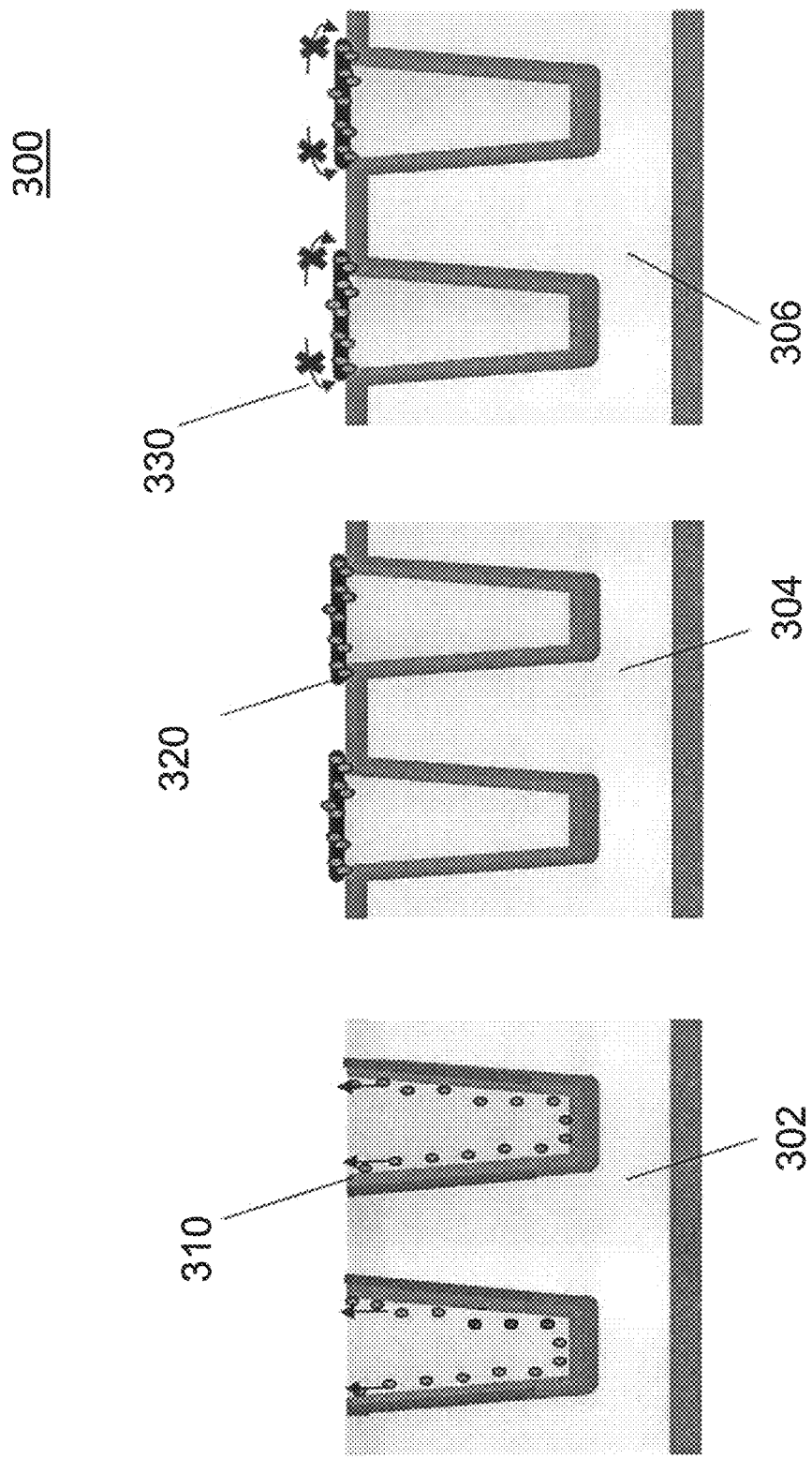
FIG. 3 illustrates 300 exemplarily how the present invention stabilizes the Co-cap by Ni diffusion from the Co-liner into the Co-cap.

FIG. 3 shows sequence 300 demonstrating one exemplary embodiment of the present invention whereby nickel is introduced into the Cu interconnect. In this exemplary embodiment, the Ni originates from a Cu seed, and the Ni diffuses subsequent to the CMP stage 302. In step 304 the cobalt caps have been formed and diffused nickel has migrated 320 to alloy with the cobalt in the cobalt caps, a mechanism that inhibits the diffusion demonstrated in FIG. 2. Thus, as shown in stage 306, the cobalt is inhibited by the formation of the (Co,Ni) alloy from diffusing into the Ru liner because, as explained shortly, the crystal structure of the cobalt caps has been at least partially transformed into the more stable FCC (face centered cubic) crystal structure by the addition of the diffused nickel. Such transformation tends to hold the cobalt in place in the cobalt cap rather than diffusing out into the Ru liner, as in stage 206 of FIG. 2.

Thus, one mechanism of the present invention is that the Co-cap can be stabilized by providing a CoNi alloy to prevent diffusion of Co from the cap into the Ru liner. More specifically, the addition of Ni to Co changes the crystal structure from hexagonal close-packed (HCP) cobalt (εCo) crystal structure (e.g., εCo phase) in the cobalt cap, which has solubility in the HCP Ru, into the αCo crystal structure (e.g., αCo phase), which is FCC (face centered cubic) and stable. The (αCo, Ni) alloy forms at lower temperatures than 422 C, and is stable when the Ni content is high enough.

Experiments have also demonstrated that including Ni in the Cu seed also prevented the cobalt liner dissolution from occurring during the plating, high temperature anneal, and CMP steps. Thus, a CoNi alloy also can be used to stabilize the cobalt liner during plating/annealing/CMP.

Figure 1:
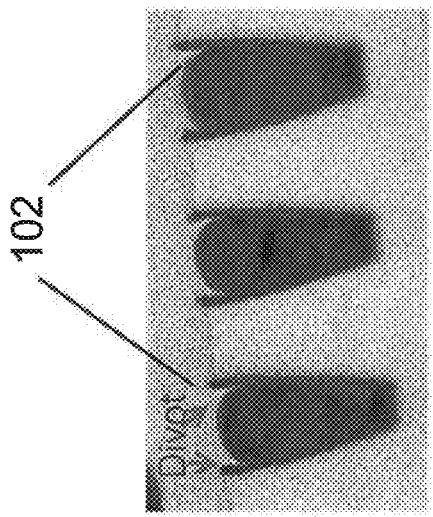
FIG. 1 exemplarily illustrates top divots 102 at the Cu—Co liner interface after a CMP processing.

Additionally, the present inventors have been able to demonstrate that nickel segregates to the interior of the cobalt liner to alloy with the cobalt. This means that having nickel in the interconnect structure prior to the CMP stage permits the nickel to diffuse to protect the cobalt-copper interface, so that the divots shown in FIG. 1 are significantly reduced, as indicated by post-CMP cross sectional analyses, thereby providing another exemplary embodiment of the present invention.

Although nickel has been used to explain the present invention, similar results would be provided using palladium (Pd), by reason that this element forms alloys similar to alloys formed by nickel, and mixtures of Ni and Pd are also envisioned as taught by the present invention.

Figure 4:
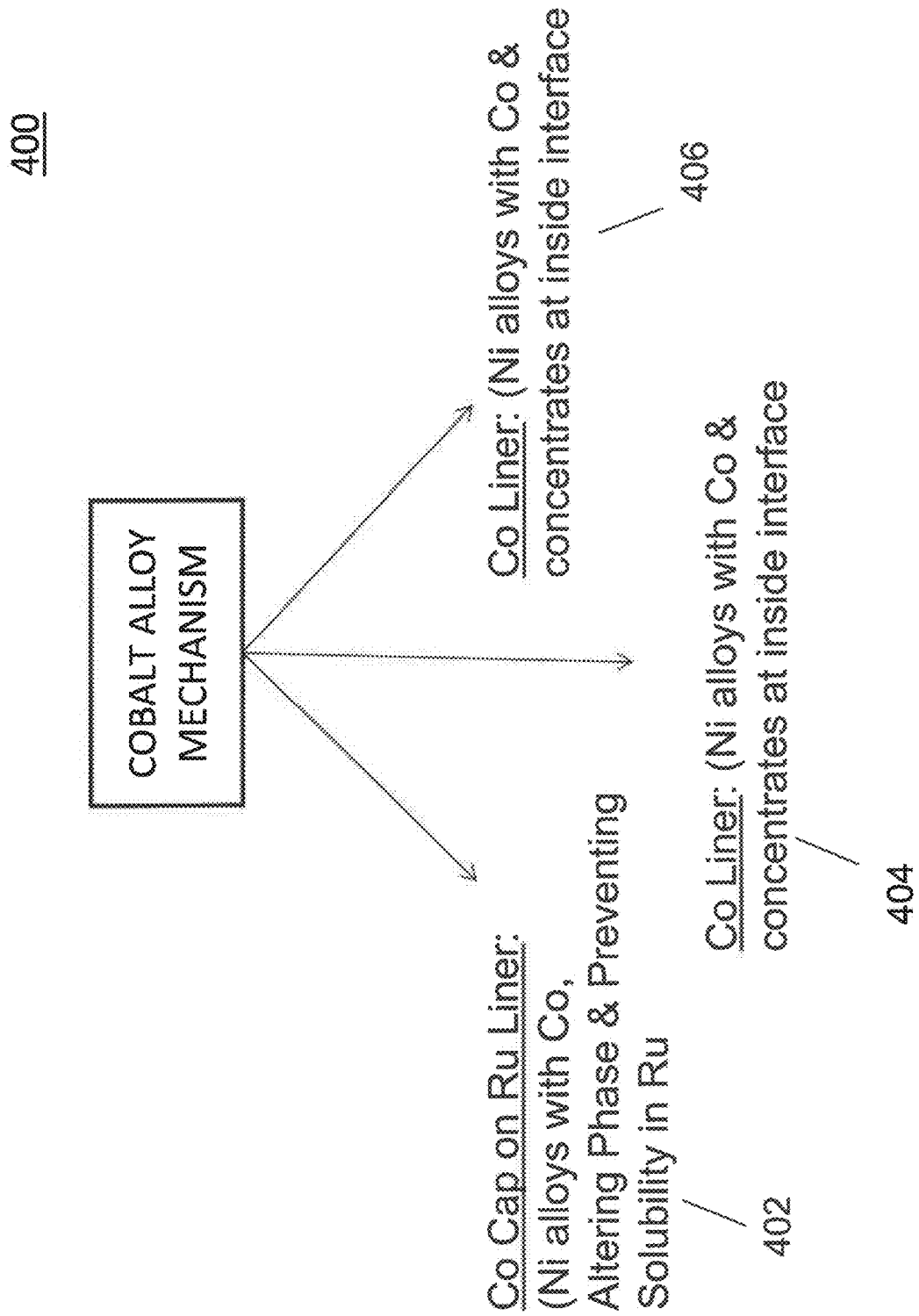
FIG. 4 illustrates three exemplary embodiments 400 described by the present invention.

As explained, introducing nickel into the interface structure can have a number of beneficial effects on copper interconnects. From the above discussion, it can be deduced that the present invention includes at least three exemplary embodiments 400, as illustrated in FIG. 4. The first exemplary embodiment 402 is the alloying of Ni with Co in the Co-cap, thereby altering the phase from HCP εCo into FCC αCo, which prevents solubility of Co in the Ru liner.

The second exemplary embodiment 404 is the alloying of Ni with Co in the Co-liner. In this embodiment, the Ni will concentrate at the inside interface, thereby decreasing opportunity of Co to diffuse during electromigration. The third exemplary embodiment 406 concerns the CMP divots shown in FIG. 1. In this embodiment, the Ni resists chemical attack of Co, thereby reducing divot formation.

It is noted that the CoNi alloy is made by a self-forming process where the Ni segregates to the Co. Thus, given a dopant, for example, Ni, that can diffuse throughout the copper. This dopant diffuses until it reacts with a more favorable material, for example, Co, whereby it becomes immobile due to the reaction.

Figure 5:
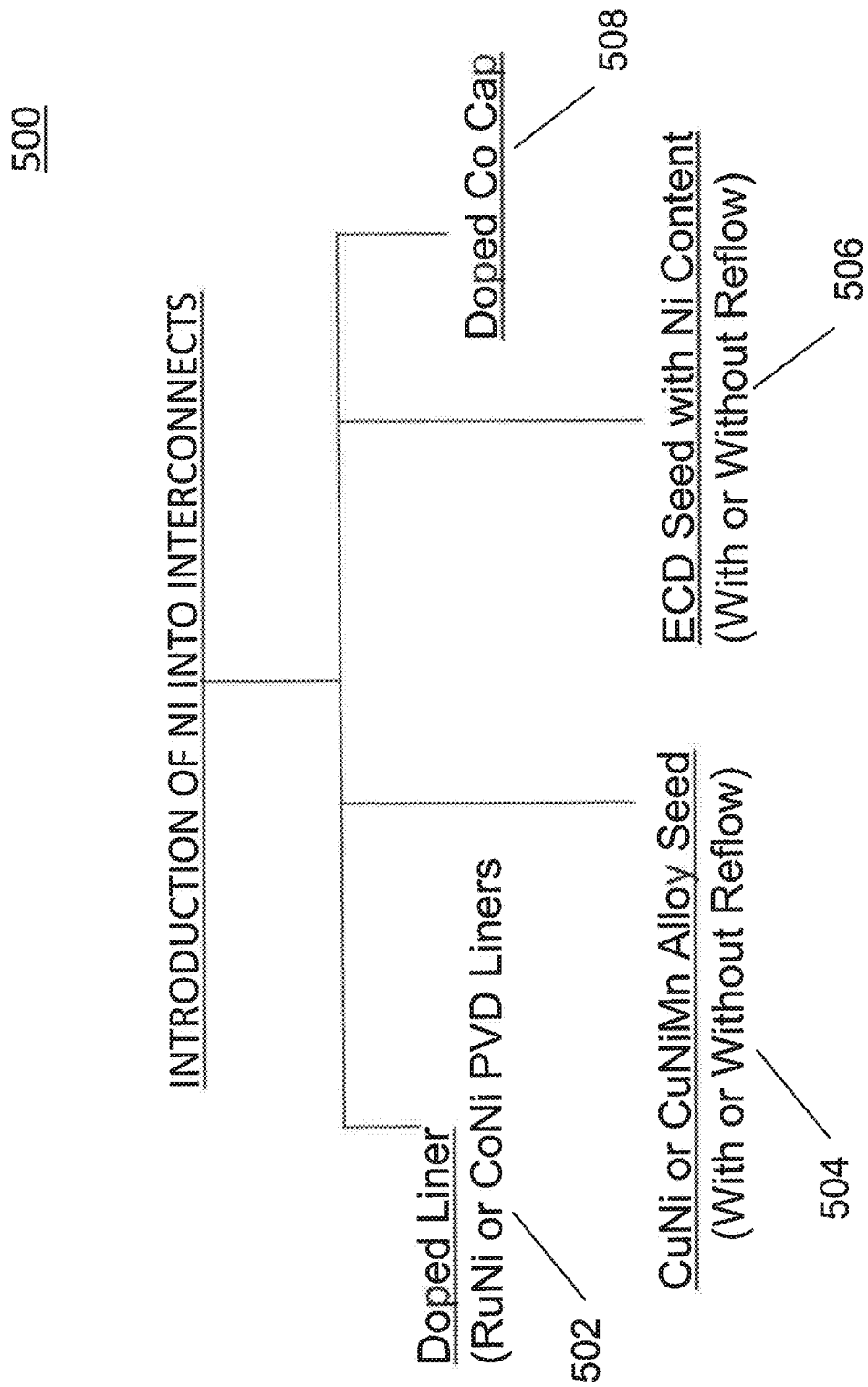
FIG. 5 illustrates four exemplary mechanisms 500 by which Ni can be introduced into interconnects.

FIG. 5 shows various and exemplary mechanisms 500 by which Ni can be introduced into the interconnects. In a first mechanism 502, a liner is doped. For example, either the Ru liner is doped to provide RuNi or Co-liner is doped to provide CoNi PVD (Physical Vapor Deposition). In a second exemplary mechanism 504, the copper Cu includes an alloy seed, for example, CuNi or CuNiMn, with or without reflow. Reflow is a process of heating a wafer that has a thin metal seed layer on it (ex. Copper). The heat allows the thin Cu to diffuse along the surface down into trenches/vias, where it gets stuck due to capillary action. It allows for superconformal filling of features without plating. The "subsequent annealing" refers to a grain growth anneal that is typical after filling the features.

In a third mechanism 506, an ECD (electrochemical deposition) is seeded with Ni-content, with or without reflow. For example, Cu and Ni can be co-deposited in both acidic and basic plating solutions, either simultaneously or in multilayer structures. [In a fourth mechanism 508, the Co-cap is doped by a deposition of Ni. For example, if using a PVD target, one can make a target out of CoNi alloy to sputter. If using CVD, one can have a precursor gas that contains both Co and Ni to deposit as the cap.

Figure 6:
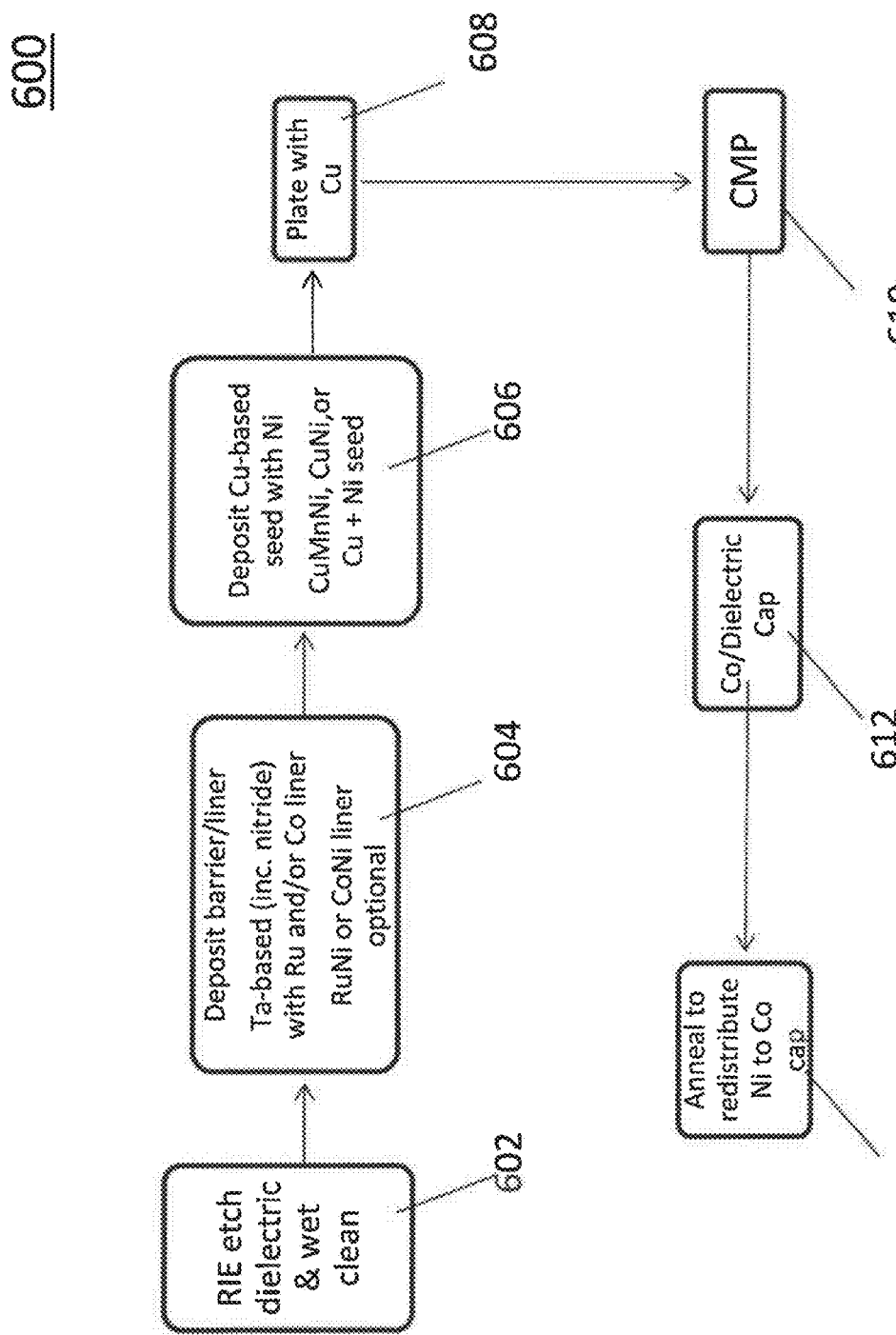
FIG. 6 illustrates a first process flow 600 of one mechanism for introducing Ni.

FIG. 6 shows an exemplary first process flow 600 involving a seed mechanism to implement the invention in a wiring layer. In step 602 an RIE etch is used to etch a dielectric layer in a pattern of trenches to contain the interconnect wiring of that layer. In step 604 the barrier/liner material is deposited, followed by a deposit of seed material in step 606, and a plating of copper in 608 to form the wiring interconnect. In step 610 a CMP process polishes off surface materials not inside the trenches, thereby forming the interconnect patterns intended for this metallization layer. In step 612 the cobalt-cap material is deposited, which is annealed in step 614. The anneal treatment provides the temperature sufficient to cause the Ni to diffuse, thereby redistributing Ni into the Co-cap. Anneal conditions vary between semiconductor companies, ranging from, for example, 100° C. for one hour, up to, for example, 350° C. for 30 minutes. It is noted that the Co deposition is selective, meaning that it deposits only on metal surfaces, so there is typically no reason to remove Co from unintended areas of the chip.

Figure 7:
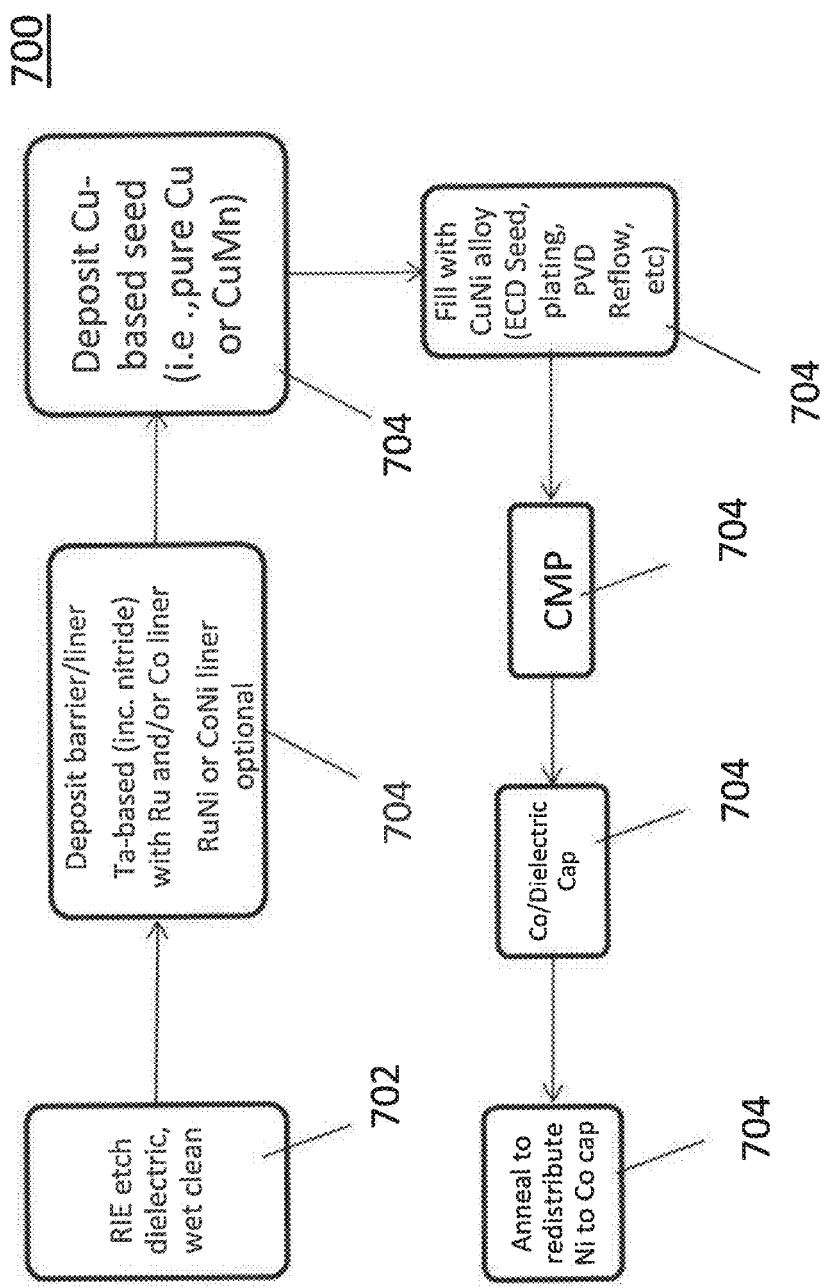
FIG. 7 illustrates a second process flow 700 of another Ni introduction mechanism.

FIG. 7 shows a second exemplary process flow 700 in which steps 702 and 710-714 correspond to steps 602 and 610-614 but steps 706 and 708 differ from steps 606 and 608. It is noted that, in step 708, "ECD" means Electro Chemical Deposit, "PVD" means Physical Vapor Deposition, so that this step refers to depositing a thin metal layer with PVD and then heating the wafer to reflow the metal into the patterned features.

Figure 8:
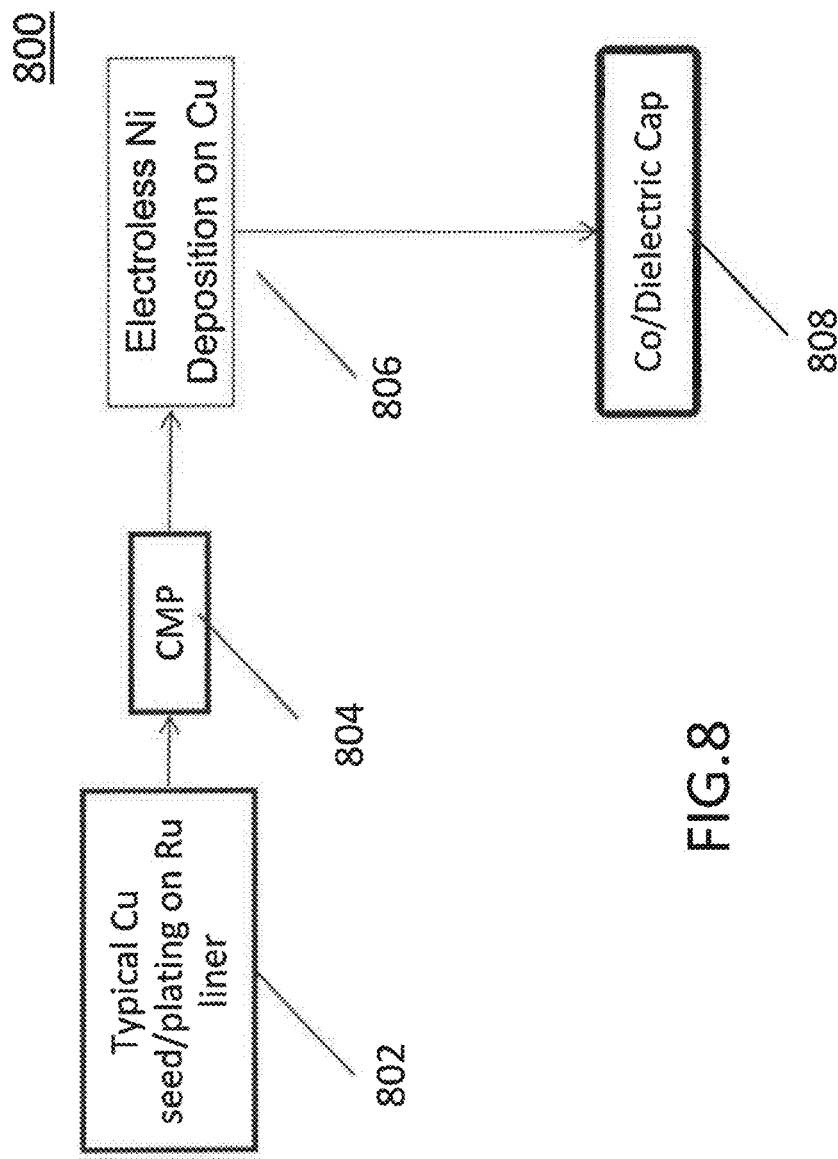
FIG. 8 illustrates a third process flow 800 of another Ni introduction mechanism, using electroless Ni deposition.
Figure 9:
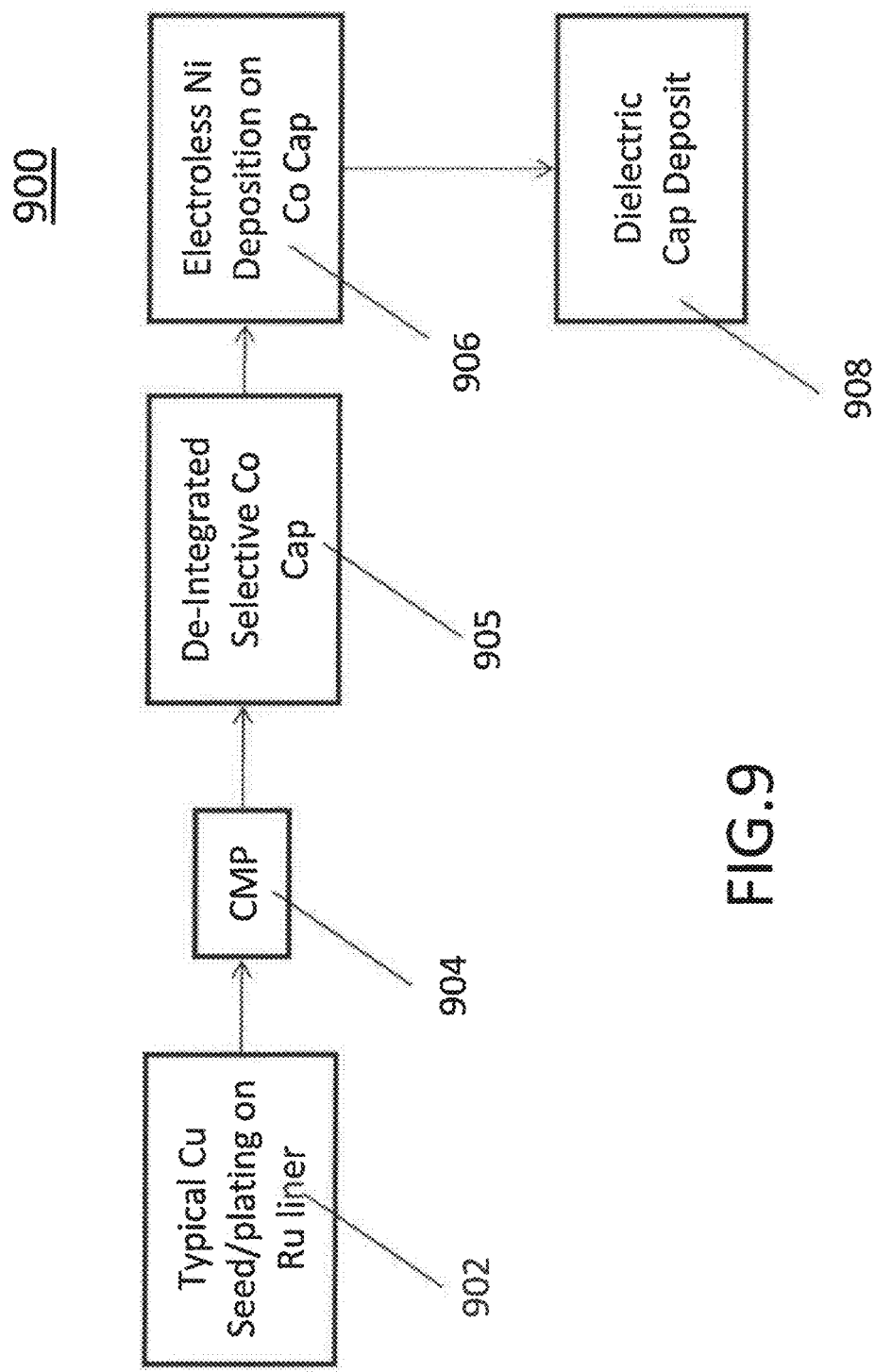
FIG. 9 illustrates a fourth process flow 800 of another Ni introduction mechanism, also using electroless deposition.

FIG. 8 and FIG. 9 show exemplary process flows 800,900 using electroless Ni deposition. Electroless deposition is an established plating method of Ni selective to metals, whereas doing selective Ni chemical vapor deposition (CVD) may require more development of precursors. Electroless deposition is typically also faster, since the selective CVD process is relatively slow (tens of minutes per wafer)

In steps 802, 902 of FIG. 8 and FIG. 9, copper is plated onto an Ru liner layer, which is polished off in CMP processing 804, 904 except for material inside of trenches that form the desired wiring pattern for a metallization layer. In step 905 the description "de-integrated selective Co Cap" refers to the typical fabrication mechanism in which the Co cap is not deposited in the same tool as a dielectric cap material deposition immediately. This de-integrated processing introduces more oxygen to the system but allows tooling flexibility. The electroless Ni deposition occurs in steps 806, 906, and cobalt cap material and dielectric layer are deposited in steps 810,910. It is noted that steps 806, 906 demonstrates that Ni could be deposited on top of the Co-cap or before deposition of the Co-cap.

Since there might be 12 or more metallization layers implemented in BEOL, each with a unique pattern of wiring, the exemplary process flows would be required on each metallization layer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising, in a fabrication stage of a metallization layer of a semiconductor device in which copper is used for an interconnect material and cobalt is used to encapsulate said copper, introducing a material that will interact with said cobalt to cause a hexagonal-close-packed (HCP) crystal structure of cobalt to change to a face-centered-cubic (FCC) crystal structure of cobalt, said FCC crystal structure providing a resistance of said cobalt to migrate.

2. The method of claim 1, wherein said introduced material comprises nickel (Ni).

3. The method of claim 1, wherein said introduced material comprises palladium (Pd).

4. The method of claim 1, wherein said encapsulating said copper further comprises a liner material and said introduced material inhibits a migration of cobalt into said liner.

5. The method of claim 4, wherein said liner material comprises Ruthenium (Ru).

6. The method of claim 1, wherein said cobalt alloy inhibits a chemical attack on cobalt, thereby protecting against a formation of divots during a chemical mechanical polishing/planarization (CMP) processing of said metallization layer.

7. The method of claim 1, wherein said introduced material is introduced using a doped liner component used in said encapsulating said copper.

8. The method of claim 7, wherein said liner comprises ruthenium (Ru).

9. The method of claim 1, wherein said introduced material is introduced as an alloy seed material of said copper.

10. The method of claim 1, wherein said encapsulating said copper comprises providing a cobalt cap on top of said copper, and said introduced material is introduced by doping said cobalt cap with said introduced material.

11. The method of claim 1, wherein said introduced material is introduced using an electroless deposition process.

12. The method of claim 1, wherein said encapsulating said copper further comprises a liner comprising Ruthenium (Ru) and said introduced material inhibits a migration of cobalt into said Ru liner.

13. A semiconductor chip, as fabricated using the method of claim 1.

14. A semiconductor device comprising a semiconductor chip of claim 13.

15. A method of inhibiting an electro-migration of copper (Cu) in copper interconnects in metallization layers of a chip, said copper interconnects encapsulated by a liner comprising cobalt (Co) and a cap comprising cobalt, said method comprising introducing a material that interacts with said cobalt to cause a hexagonal-close-packed (HCP) crystal structure of cobalt to change to a face-centered-cubic (FCC) crystal structure of cobalt, said FCC crystal structure providing a resistance of said cobalt to migrate.

16. The method of claim 15, wherein said introduced material comprises at least one of nickel (Ni) and palladium (Pd).

17. The method of claim 15, wherein said introduced material is introduced using a doped liner component used in said encapsulating said copper.

18. A semiconductor chip, comprising:
a substrate having a plurality of electronic component elements fabricated on a top surface thereof, in a device layer; and
a plurality of metallization layers formed successively on top of said device layer, to interconnect said electronic component elements using copper (Cu), each said metallization layer having a different interconnect pattern,
wherein said Cu in said Cu interconnect pattern in each said metallization layer is encapsulated in a layer of cobalt and wherein a material is introduced into an interconnect structure of said interconnect pattern of each said metallization layer that forms an alloy that interacts with said cobalt to cause a hexagonal-close-packed (HCP) crystal structure of cobalt to change to a face-centered-cubic (FCC) crystal structure of cobalt, said FCC crystal structure providing a resistance of said cobalt to migrate.

19. The semiconductor chip of claim 18, wherein said introduced material comprises at least one of nickel (Ni) and palladium (Pd).

20. A semiconductor chip, comprising:
a substrate having a plurality of electronic component elements fabricated on a top surface thereof, in a device layer; and
a plurality of metallization layers formed successively on top of said device layer, to interconnect said electronic component elements using copper (Cu), each said metallization layer having a different interconnect pattern,
wherein said Cu in said Cu interconnect pattern in each said metallization layer is encapsulated in a layer of cobalt and wherein a material is introduced into an interconnect structure of at least one said interconnect pattern of at least one said metallization layer that interacts with said cobalt to cause a hexagonal-close-packed (HCP) crystal structure of cobalt to change to a face-centered-cubic (FCC) crystal structure of cobalt, said FCC crystal structure providing a resistance of said cobalt to migrate.

* * * * *